(12) United States Patent
Cho

(10) Patent No.: US 11,765,959 B2
(45) Date of Patent: Sep. 19, 2023

(54) DISPLAY DEVICE

(71) Applicant: LG Display Co., Ltd., Seoul (KR)

(72) Inventor: Woo-Chan Cho, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 438 days.

(21) Appl. No.: 17/127,146

(22) Filed: Dec. 18, 2020

(65) Prior Publication Data

US 2021/0202617 A1 Jul. 1, 2021

(30) Foreign Application Priority Data

Dec. 31, 2019 (KR) .......................... 10-2019-0180179

(51) Int. Cl.
*H10K 59/121* (2023.01)
*H10K 59/60* (2023.01)
*H04N 23/57* (2023.01)
*H10K 59/12* (2023.01)
*H10K 59/50* (2023.01)
*H10K 59/35* (2023.01)
*G09G 3/3233* (2016.01)

(52) U.S. Cl.
CPC .............. *H10K 59/60* (2023.02); *H04N 23/57* (2023.01); *H10K 59/12* (2023.02); *H10K 59/121* (2023.02); *H10K 59/352* (2023.02); *H10K 59/50* (2023.02); *G09G 3/3233* (2013.01)

(58) Field of Classification Search
CPC ......... G09G 3/3233; G09G 2340/0407; H10K 59/121–1216; H10K 59/352
See application file for complete search history.

(56) References Cited

U.S. PATENT DOCUMENTS

2013/0083080 A1* 4/2013 Rappoport ............... G09G 3/20
345/698
2020/0380917 A1* 12/2020 Zhu ...................... G09G 3/3216

FOREIGN PATENT DOCUMENTS

| KR | 10-2006-0073797 A | 6/2006 |
|----|-------------------|--------|
| KR | 10-0719696 B1 | 5/2007 |
| KR | 10-2018-0061723 A | 6/2018 |
| KR | 10-2031648 B1 | 10/2019 |

* cited by examiner

*Primary Examiner* — Daniel P Shook
(74) *Attorney, Agent, or Firm* — Birch, Stewart, Kolasch & Birch, LLP

(57) ABSTRACT

A display device is discussed, which can ensure transmittance and drive regions having different resolutions using the same driver IC due to a structural difference therebetween within a panel, in a structure having a camera provided under a substrate. The display device can include the substrate having a first region and a second region, a first array unit in the first region and having at least one subpixel having a first light emitting part, and a second array unit in the second region and having a plurality of subpixels. Each of the plurality of subpixels includes a second light emitting part having a smaller area than an area of the first light emitting part.

17 Claims, 13 Drawing Sheets

DISPLAY DEVICE

CROSS-REFERENCE TO RELATED APPLICATIONS

This application claims the priority benefit to the Korean Patent Application No. 10-2019-0180179, filed on Dec. 31, 2019 in the Republic of Korea, the entire contents of which are hereby expressly incorporated by reference as if fully set forth herein into the present application.

BACKGROUND OF THE INVENTION

Field of the Invention

The present invention relates to a display device, and more particularly, to a display device which can ensure transmittance and drive regions having different resolutions using the same driver IC due to a structural difference therebetween within a panel, in a structure having a camera provided under a substrate.

Discussion of the Related Art

As our society has entered the information age, the field of displays for visually displaying electrical information signals has rapidly developed. In order to satisfy such development, various flat display devices having excellent performance, such as slimness, light weight and low power consumption, have been developed and have rapidly replaced conventional cathode ray tubes (CRTs).

As examples of such flat display devices, there are a liquid crystal display (LCD) device, a plasma display panel (PDP) device, a field emission display (FED) device, an organic light emitting diode (OLED) display device, etc.

SUMMARY OF THE INVENTION

Accordingly, the present invention is directed to a display device that substantially obviates one or more problems due to limitations and disadvantages of the related art.

An object of the present invention is to provide a display device which can ensure transmittance and drive regions having different resolutions using the same driver IC due to a structural difference therebetween within a panel, in a structure having a camera provided under a substrate.

For example, in the structure having the camera provided under the substrate, current density is distributed due to the structural difference between the regions within the panel by adjusting an active layer and a light emitting part required by each region on the substrate having the regions having the different resolutions so as to prevent overcurrent from flowing to a restricted region, thereby being capable of improving the lifespan of the display device and achieving stability of operation of the display device.

Additional advantages, objects, and features of the invention will be set forth in part in the description which follows and in part will become apparent to those having ordinary skill in the art upon examination of the following or can be learned from practice of the invention. The objectives and other advantages of the invention can be realized and attained by the structure particularly pointed out in the written description and claims hereof as well as the appended drawings.

To achieve these objects and other advantages and in accordance with the purpose of the invention, as embodied and broadly described herein, a display device includes a substrate divided into a first region and a second region, a first array unit provided in the first region and including at least one subpixel including a first light emitting part provided therein, and a second array unit provided in the second region and including a plurality of subpixels, each of the plurality of subpixels including a second light emitting part having a smaller area than an area of the first light emitting part, wherein an area of a first active layer of the at least one subpixel in the first array unit is greater than an area of a second active layer of each of the subpixels of the second array unit.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE EMBODIMENTS

Figure 1:
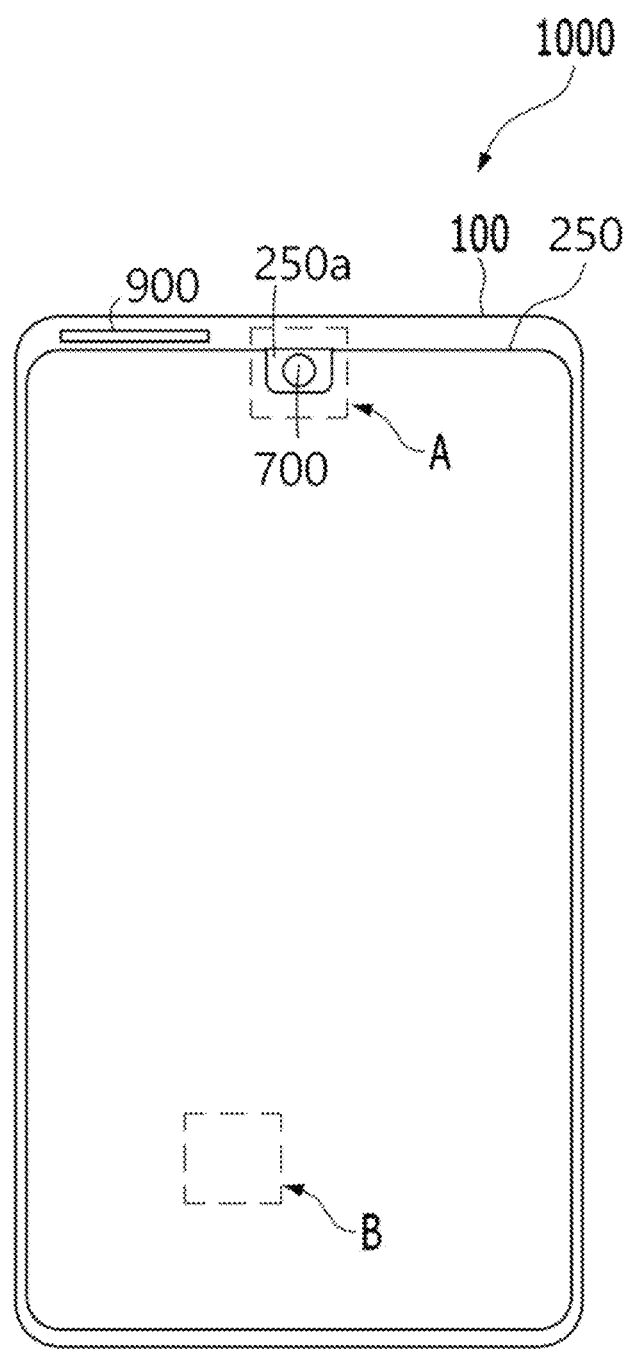
FIG. 1 is a plan view illustrating a display device according to a first embodiment of the present invention.

Reference will now be made in detail to the exemplary embodiments of the present invention, examples of which are illustrated in the accompanying drawings. In the following description of the embodiments and the drawings, the same or similar elements are denoted by the same reference numerals throughout the specification. In the following description of the embodiments of the present invention, a detailed description of known functions and configurations incorporated herein will be omitted when it can make the subject matter of the present invention rather unclear. Further, the names of elements used in the following description of the embodiments of the present invention are selected in consideration of ease of preparation of the specification, and can thus differ from the names of parts of an actual product.

The shapes, sizes, ratios, angles and numbers of elements given in the drawings to describe the embodiments of the present invention are merely exemplary, and thus, the present invention is not limited to the illustrated details. In the following description of the embodiments, the terms "including", "comprising" and "having" are to be interpreted as indicating the presence of one or more characteristics, numbers, steps, operations, elements or parts stated in the specification or combinations thereof, and do not exclude the presence of other characteristics, numbers, steps, operations, elements, parts or combinations thereof, or the possibility of adding the same, unless the term "only" is used. It will be understood that a singular expression of an element(s) encompasses a plural expression unless stated otherwise.

In the interpretation of elements included in the various embodiments of the present invention, it is to be interpreted that the elements include error ranges unless stated otherwise.

In the following description of the embodiments, it will be understood that, when positional relationships are expressed, for example, when an element is said to be "on", "above", "under" or "beside" another element, the two elements can directly contact each other, or one or more other elements can be interposed between the two elements, unless the term "just" or "directly" is used.

In the following description of the embodiments, it will be understood that, when temporal relationships are expressed, for example, when terms expressing a sequence of events, such as "after", "subsequent to", "next" and "before" are used, the terms encompass both a continuous relationship between the events and a discontinuous relationship between the events, unless the term "just" or "directly" is used.

In the following description of the embodiments, it will be understood that, when the terms "first", "second", etc. are used to describe various elements, these terms are used merely to distinguish the same or similar elements and may not define order. Therefore, a first element described hereinafter could be termed a second element without departing from the technical scope of the invention.

Respective features of the various embodiments of the present invention can be partially or wholly coupled to or combined with each other and be interlocked or driven in various technical manners, and the respective embodiments can be implemented independently of each other or be implemented together through connection therebetween.

Figure 2A:
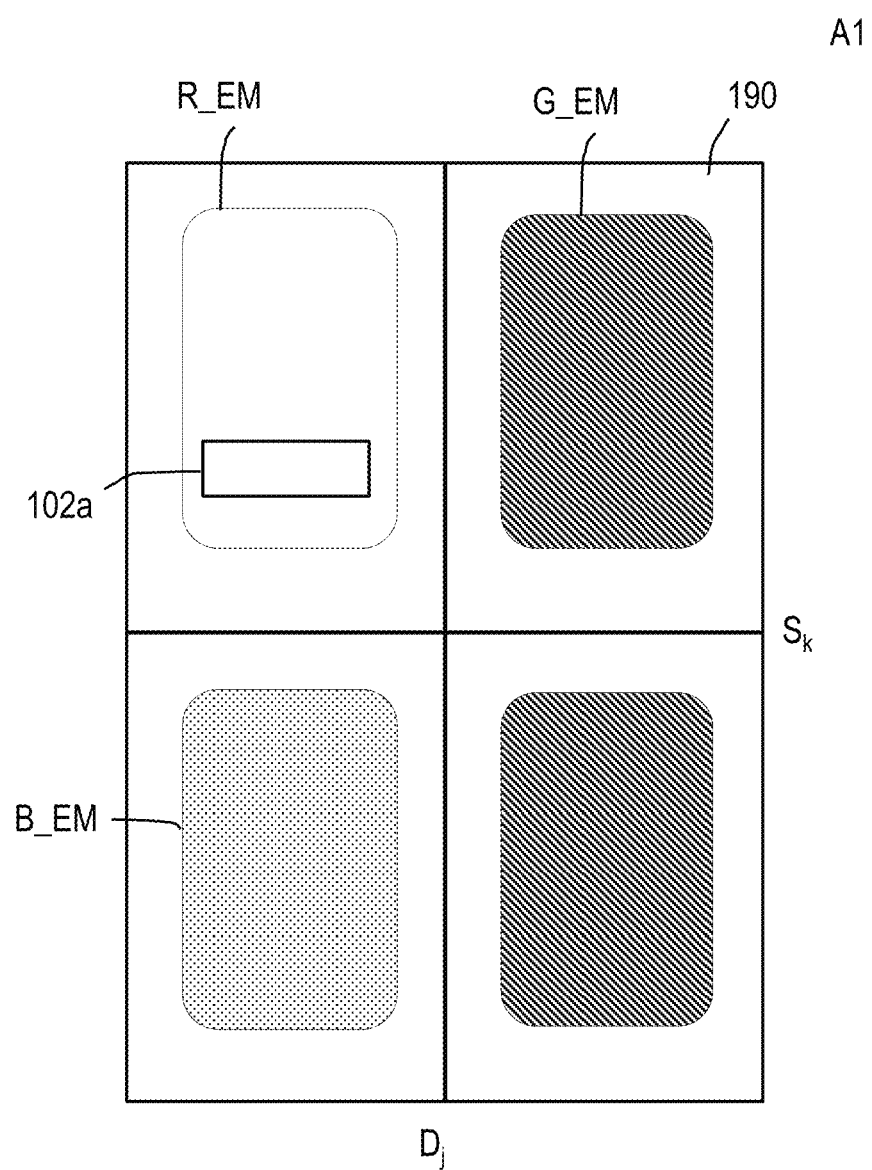
FIGS. 2A and 2B are enlarged plan views illustrating regions A and B of FIG. 1, respectively.
Figure 2B:
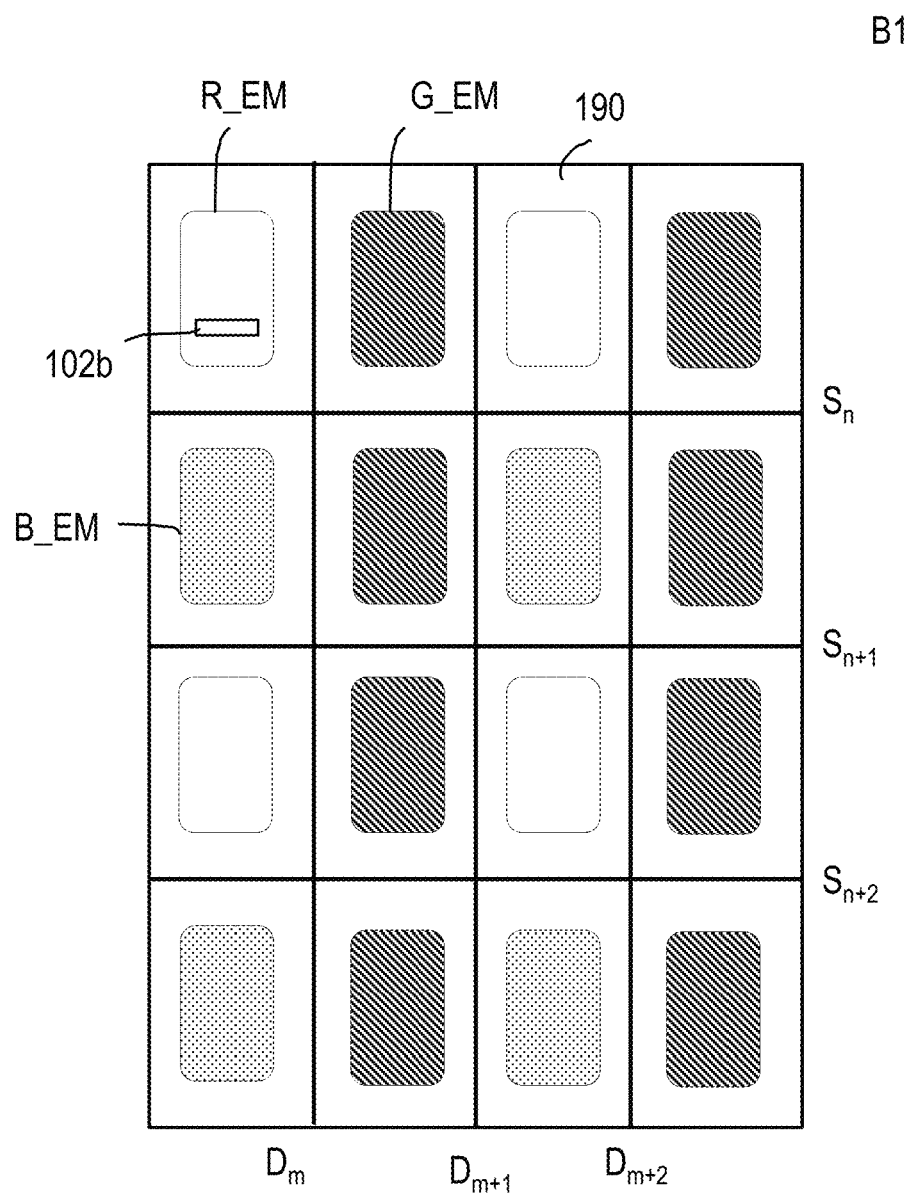
Figure 3:
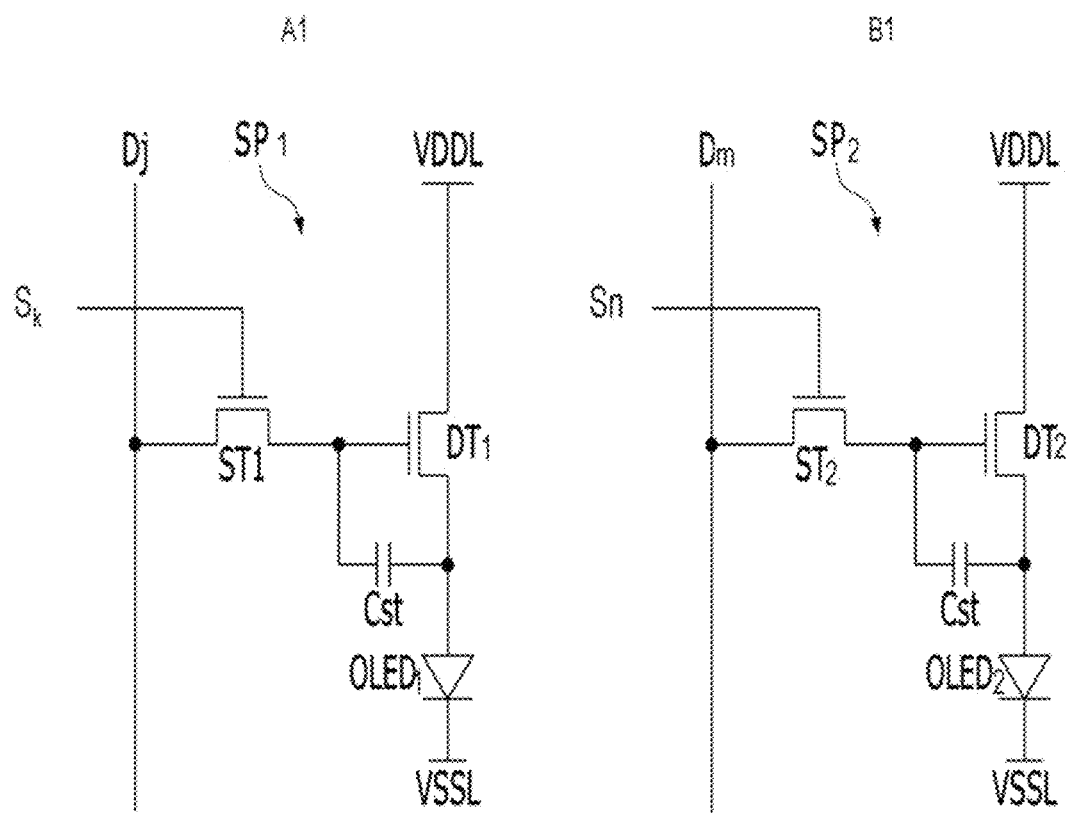
FIG. 3 shows circuit diagrams of respective subpixels in the region A and the region B.
Figure 4:
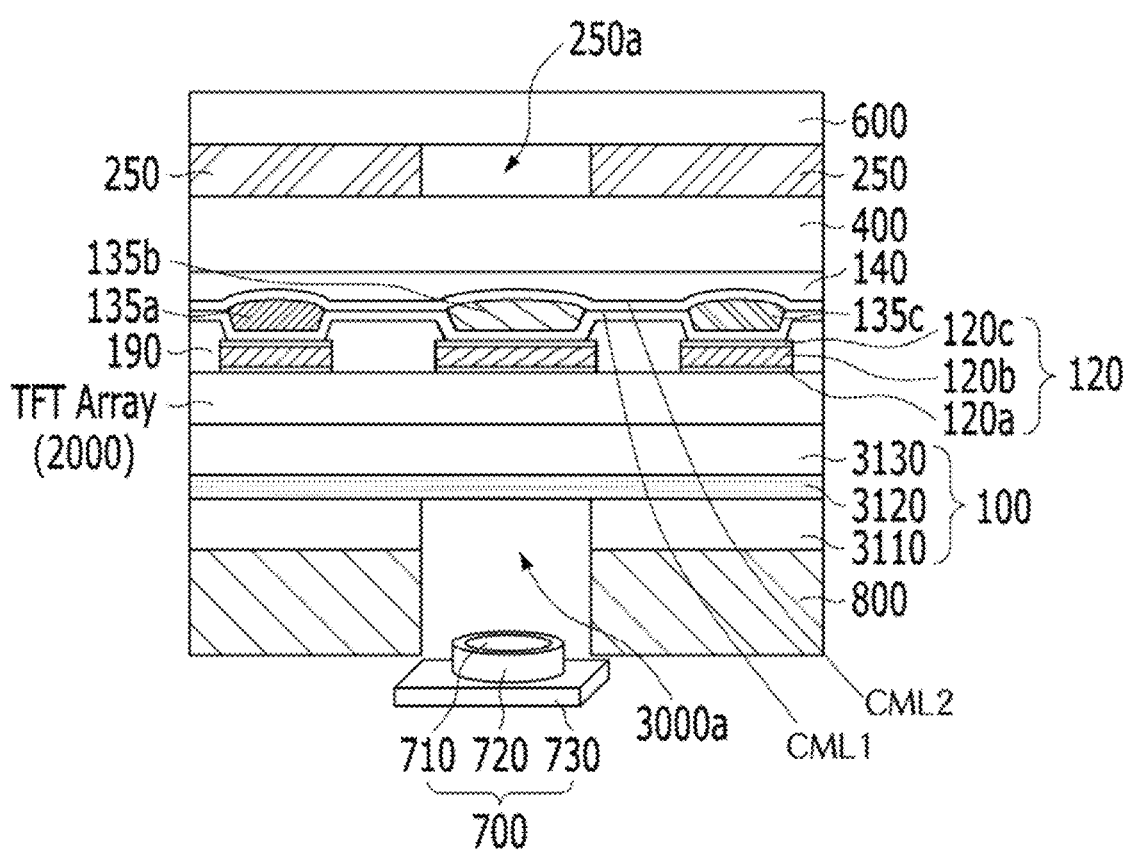
FIG. 4 is a cross-sectional view of the region A of FIG. 2A.

FIG. 1 is a plan view illustrating a display device according to a first embodiment of the present invention, FIGS. 2A and 2B are enlarged plan views illustrating regions A and B of FIG. 1, respectively, FIG. 3 shows circuit diagrams of respective subpixels in the region A and the region B, and FIG. 4 is a cross-sectional view of the region A of FIG. 2A. All the components of the display device according to all embodiments of the present invention are operatively coupled and configured.

As shown in FIG. 1, a display device 1000 according to the first embodiment of the present invention includes a substrate 100 divided into (or includes) a first region A and a second region B, where a first array unit A1 provided in the first region A and including at least one subpixel SP1 including a first light emitting part provided therein, and a second array unit B1 provided in the second region B and including a plurality of subpixels SP2, each of which includes a second light emitting part having a smaller area than that of the first light emitting part, and the area of a first active layer 102a of the subpixel SP1 in the first array unit A1 can be greater than the area of a second active layer 102b of the subpixel SP2 of the second array unit B1. The substrate 100 can further include other regions/areas, and can include one or more of the first regions A and/or the second regions B.

The display device 1000 of the present invention is characterized in that, when the substrate 100 has the array units A1 and B1 having different resolutions, as shown in FIGS. 2A and 2B, the array units A1 and B1 are driven using the same driver IC.

Each of the first active layer 102a and the second active layer 102b of the first and second array units A1 and B1 having different resolutions can be included in the corresponding one of first and second driving thin film transistors DT1 and DT2 of the subpixels SP1 and SP2 of the first and second array units A1 and B1.

The first and second driving thin film transistors DT1 and DT2 can be conductively or electrically connected to the same integrated circuit (driver IC) 900. Thus, the display device 1000 of the present invention can drive different forms of driving thin film transistors DT1 and DT2 without addition of a separate driver IC.

The first driving thin film transistor DT1 is driven at a higher current than the second driving thin film transistor DT2 by the same data voltage, and such a first driving thin film transistor DT1 is realized by increasing the area of the first active layer 102a.

If first and second driving thin film transistors provided in regions having different resolutions have the same size, in order to drive a light emitting part having a large area located in the region having a relatively low resolution, overcurrent flows in the small active area of the first driving thin film transistor of a first array unit, and thereby, the lifespan of the first driving thin film transistor is drastically shortened. In the present invention which is made in view of the above problem or limitations, not only light emitting parts R_EM, G_EM and B_EM of the first array unit A1, to which high current is applied, but also the active layers of driving thin film transistors connected to the light emitting parts R_EM, G_EM and B_EM are increased in order to prevent such a problem.

For example, in the display device 1000 according to the present invention, both the size of the active layers 102a of the first driving thin film transistors DT1 located in the low-resolution region and the size of anodes connected to the first driving thin film transistors DT1 are increased, and high current is distributed to the increased area, and thereby, the decreased lifespan attributable to the high current flowing in a restricted area can be solved or addressed.

Here, the first active layer 102a in the first array unit A1 can have a first width W1 and a first length L1, and the second active layer 102b in the second array unit B1 can have a second width W2 smaller than the first width W1 or a second length L2 greater than the first length L1.

Alternatively, the first active layer 102a can have the first width W1 and the first length L1, and the second active layer 102b can have the second width W2 smaller than the first width W1 and the second length L2 greater than the first length L1. In general, as the width of an active layer increases and as a channel length of the active layer decreases, a current receiving capacity can increase, and thus, in the present invention, on this occasion, the width of the first active layer 102a in the region A having the low resolution is increased and the length of the first active layer 102a is decreased. As circumstances require, only one of the increased width and the decreased length of the first active layer 102a can be applied.

When the area of the first active layer 102a of the first driving thin film transistor DT1 is changed, the area of the active layer of a switching thin film transistor connected to the first driving thin film transistor DT1 can also be changed in response thereto.

Figure 9A:
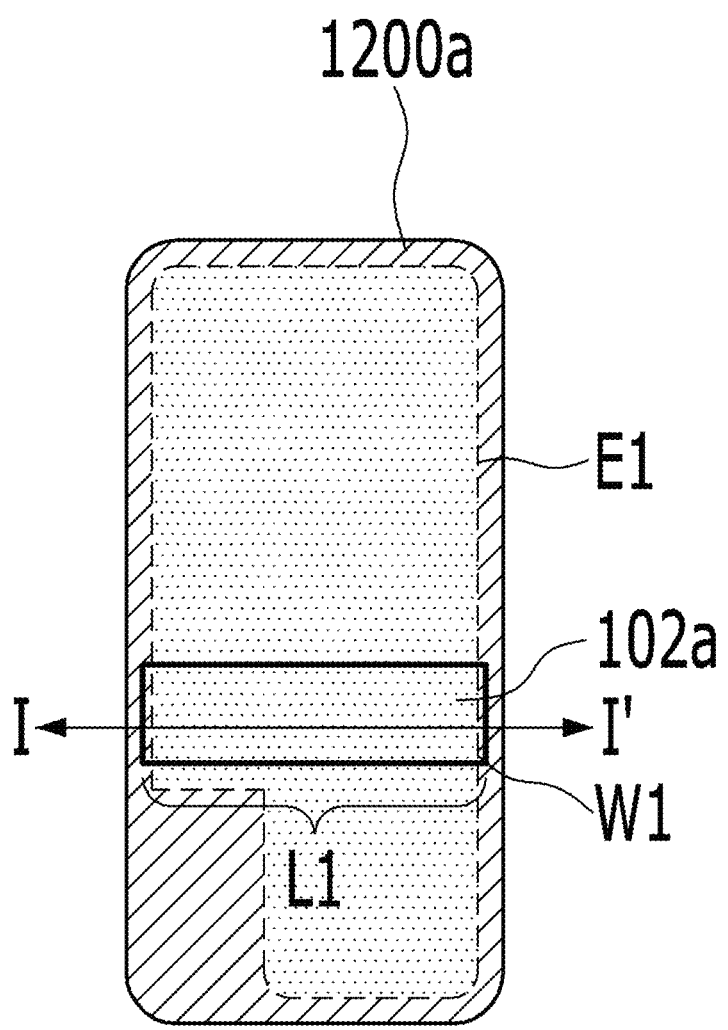
FIGS. 9A and 9B are plan views illustrating the relationships between a semiconductor layer and an anode of a driving thin film transistor in each of a region A and a region B of the display device according to the second embodiment of the present invention, respectively.
Figure 9B:
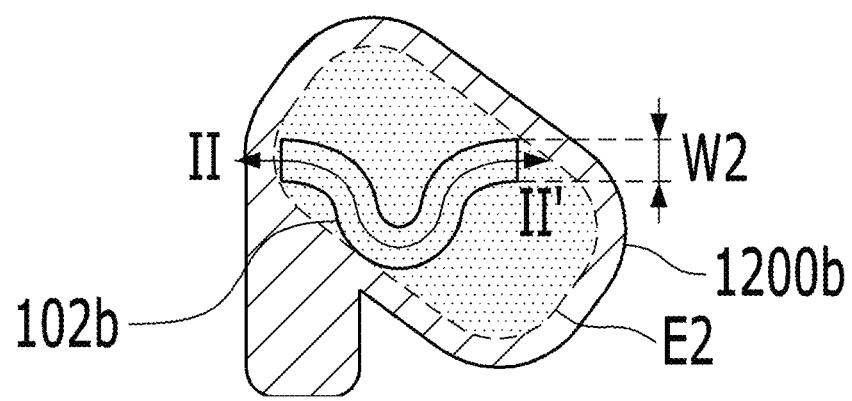

The subpixel SP1 of the first array unit A1 can include the first driving thin film transistor DT1 and a first light emitting element OLED1 connected to the first driving thin film transistor DT1, each of the subpixels SP2 of the second array unit B1 can include the second driving thin film transistor DT2 and a second light emitting element OLED2 connected to the second driving thin film transistor DT2, each of the first and second light emitting elements OLED1 and OLED2 can include an anode 120, a light emitting layer 135a, 135b or 135c, and a cathode 140, and the area of the anode 120 of the first light emitting element OLED1 (with reference to 1200a of FIG. 9A) can be greater than the area of the anode 120 of the second light emitting element OLED2 (with reference to 1200b of FIG. 9B). The reason for this is to supply the amount of current, corresponding to the increased current capacity realized by the increased area of the active layer 102a, to the anode 120.

The first active layer 102a can overlap the anode 120 of the first light emitting element OLED1, and the second active layer 102b can overlap the anode 120 of the second light emitting element OLED2.

The display device 1000 can further include at least one of a first common layer CML1 formed between the anodes 120 and the light emitting layers 135a, 135b and 135c, and a second common layer CML2 formed between the cathode 140 and the light emitting layers 135a, 135b and 135c, and the first common layer CML1 and the second common layer CML2 can be continuously formed throughout the subpixels SP1 and SP2 of the first and second array units A1 and A2.

The substrate 100 can be, for example, a single polymer film or a glass substrate, or, as shown in FIG. 4, the substrate 100 can include a first polymer layer 3110, an inorganic interlayer insulating film 3120 and a second polymer layer 3130, and the first and second array units A1 and A2 can be provided on the second polymer layer 3130. A TFT array 2000 can be provided on the second polymer layer 3130.

The first polymer layer 3110 can be a colored film or a transparent film, and the second polymer layer 3130 can be a transparent film.

A portion having a first thickness, smaller than the entire thickness of the substrate 100, can be removed from the lower surface of a portion 3000a of the substrate 100. Although FIG. 4 illustrates an example in which the first polymer layer 3110 is removed, the present invention is not limited thereto, and a portion of the first polymer layer 3110 can be removed or both the first polymer layer 3110 and the inorganic interlayer insulating film 3120 (or portions thereof) can be removed. As circumstances require, a portion of the thickness of the second polymer layer 3130 can be removed. The camera 700 can be inserted into the portion 3000a of the substrate 100 from which the portion having the first thickness is removed.

Although the illustrated example shows the camera 700 inserted into the portion 3000a of the substrate 100, any portion of the substrate 100 may not be removed and the camera 700 can be mounted directly under the substrate 100.

A protective member 800 can be further provided on the lower surface of the substrate 100 except for the portion thereof corresponding to the camera 700. The protective member 800 can be formed of a material having supporting force greater than the substrate 100, and be formed of a thin film including, for example, at least one of polyethylene naphthalate (PEN), polyethylene terephthalate (PET), polyethylene ether phthalate, polycarbonate, polyarylate, polyether imide, polyether sulfonate, polyimide, polyacrylate and other proper polymers.

Further, as shown in FIG. 2A, the first region A having the low resolution can serve as a structure corresponding to the camera 700 provided thereunder or a region which requires light transmission through the lower surface thereof, such as a transmission part. Therefore, the camera 700 can correspond to the lower surface of the substrate 100 in the first region A, as shown in FIG. 1, or, when there is no camera 700, the first region A can function as a transmission part.

Both the first region A and the second region B are located in an active area of the substrate 100 in which the subpixels SP1 and SP2 are arranged, and, in the display device of the present invention, the first and second regions A and B have different resolutions, and thus the light-emitting parts in the first and second regions A and B have different sizes, as shown in FIGS. 2A and 2B. Further, the respective subpixels SP1 and SP2 of the first and second regions A and B have different sizes, the distance between lines $S_k$ and the distance between $D_j$ in the first region A requiring transmission are relatively long, and the distance between lines $S_n$, $S_{n+1}$, . . . and the distance between $D_m$, $D_{m+1}$, . . . in the second region B not requiring transmission are relatively short so as to realize a resolution which the display device 1000 desires to achieve.

As shown in FIG. 1, a region in which the camera 700 is located will be described as one example of the first region A.

The display device 1000 according to one embodiment of the present invention can include the substrate 100, which is divided into a camera region (the region A corresponding to the camera 700 in FIG. 1) and a non-camera region (the region B except for the region A corresponding to the camera), and includes a first surface (the lower surface of the substrate 100 in FIG. 4) and a second surface, the camera 700 (in FIG. 4) which is located under the first surface of the portion of the substrate 100 corresponding to the camera region, a step part (i.e., the portion 3000a) which is formed by removing the portion having the first thickness of the substrate 100 from the first surface of the portion of the substrate 100 corresponding to the camera region (the region A), the first array unit A1, provided on the second surface of the portion of the substrate 100 corresponding to the camera region and including at least one subpixel SP1, the second array unit B1 provided on the second surface of the substrate 100 corresponding to the non-camera region and including a plurality of subpixels SP2, and an optical film configured to cover the first and second array units A1 and B1.

The display device 1000 according to the present invention has the camera 700 provided under the active area of the substrate 100 in which the subpixels are formed, and particularly, can improve an effective plane region compared to a structure in which the camera 700 is provided in an edge area outside the active area, and reduce the edge area because the camera 700 is not provided in the edge area, thereby being capable of achieving a narrow bezel.

Here, the active area means an area of the substrate 100 overlapping the optical film. The optical film can include a polarizing plate 250 configured to prevent reflection of external light, and a transparent film 250a configured to increase visibility of the camera 700. In addition, a transparent optical film configured to protect the optical film can be provided. The transparent optical film can be glass or a transparent optical film having uniform rigidity.

The edge of the substrate 100 outside the active area is referred to as a non-active area, and a pad part, pad electrodes provided in the pad part, and link lines extending from the active area to the pad electrodes can be provided in the non-active area.

Further, in the display device 1000 according to the present invention, the subpixels are also arranged in the region in which the camera 700 is located, and thus, the region in which the camera 700 is located can display an image when the camera 700 is turned off.

In the display device 1000 according to the present invention, since the array unit including the thin film transistors and the light emitting elements is also provided on the camera 700, the configuration of the substrate 100 and the elements provided on the substrate 100 is changed so that the camera 700 under the array unit is not visible to the naked eye when the region of the display device on the camera 700 emits light.

Particularly, in the display device 1000 according to the first embodiment of the present invention, the subpixels can be arranged with a first resolution in the non-camera region, as shown in FIG. 2B, and the subpixels can be arranged with a second resolution lower than the first resolution in the camera region, as shown in FIG. 2A.

In the present invention, as shown in FIG. 2A, the arrangement density of the light emitting parts R_EM, G_EM and B_EM in the first region A, i.e., the camera region corresponding to the camera 700, is lower than the arrangement density of the light emitting parts R_EM, G_EM and B_EM in the second region B, i.e., the non-camera region. This structure is implemented based on the difference in size between the light emitting parts.

In the display device 1000 according to the present invention, the light emitting parts R_EM, G_EM and B_EM in the first region A, i.e., the camera region corresponding to the camera 700, are driven at a resolution lower than that of the light emitting parts R_EM, G_EM and B_EM in the second region B, i.e., the non-camera region.

Through this structure, the optical absorbance of the corresponding elements in the camera region is increased. Thereby, when external light is supplied to the camera region, i.e., the first region A, the light emitting parts R_EM, G_EM and B_EM, the lines $S_k$ and $D_j$ and the thin film transistors connected thereto absorb the light, and thus prevent reduction in visibility and increase transmittance in the camera region, thereby preventing the elements of the camera 700 from being visually discernible from other regions when the camera 700 is turned off.

As shown in FIG. 1, the display device 1000 according to the present invention includes the light emitting parts R_EM, G_EM and B_EM provided in the respective subpixels, and the scan lines $S_n$, $S_{n+1}$, $S_{n+2}$, . . . and the data lines $D_m$, $D_{m+1}$, $D_{m+2}$, . . . configured to drive the respective subpixels. Although FIGS. 2A and 2B illustrate an example in which the scan lines $S_n$, $S_{n+1}$, $S_{n+2}$, . . . and the data lines $D_m$, $D_{m+1}$, $D_{m+2}$, . . . are arranged so as not to overlap the light emitting parts R_EM, G_EM and B_EM, the scan lines $S_n$, $S_{n+1}$, $S_{n+2}$, . . . and the data lines $D_m$, $D_{m+1}$, $D_{m+2}$, . . . can be provided so as to overlap the light emitting parts R_EM, G_EM and B_EM when the display device 1000 is a top emission type display device and thus the anodes of the light emitting elements include reflective electrodes. Each subpixel SP includes one or more scan lines $S_n$, $S_{n+1}$, $S_{n+2}$, . . . and one or more data lines $D_m$, $D_{m+1}$, $D_{m+2}$, . . . , and at least one thin film transistor is formed at the intersections of the scan lines $S_n$, $S_{n+1}$, $S_{n+2}$, . . . and the data lines $D_m$, $D_{m+1}$, $D_{m+2}$, . . . . The thin film transistor is connected to the light emitting element which determines the on/off state of the light emitting part.

In the display device 1000 according to the present invention, as shown in FIG. 2A, the camera region has a resolution which is ¼ of the resolution of the non-camera region shown in FIG. 2B, and the area of each light emitting part of the camera region is 4 times the area of each light emitting part of the non-camera region. In this case, the camera region has half the number of scan lines arranged in the horizontal direction and half the number of data lines arranged in the vertical direction, compared to the non-camera region, in the same area. Here, the distance between the scan lines and the distance between the data lines in the camera region A are twice the distance between the scan lines and the distance between the data lines of the non-camera region B, and thus, it can be understood that the area of the light emitting part of the first array unit A1 located in the camera region A is four times the area of the light emitting part of the second array unit B1 located in the non-camera region B.

For example, in the display device 1000 according to the present invention, the camera region A includes the subpixels so as to display an image but, in order to prevent the camera 700 located in the camera region A from being visible under external light when the camera 700 is turned off, the arrangement density of the light emitting parts of the array unit A1 in the camera region A is set to be lower than the arrangement density of the light emitting parts of the array unit B1 in the non-camera region B. Here, the distance between the scan lines and the distance between the data lines in the camera region are wider than the distance between the scan lines and the distance between the data lines in the non-camera region, and the area of each light emitting part in the camera region having a low resolution is greater than the area of each light emitting part in the non-camera region having a high resolution.

As shown in FIGS. 2A and 2B, the distance between the scan lines $S_k$, . . . and the distance between the data lines $D_j$, . . . of the first array unit A1 in the camera region A, which are configured to divide the respective subpixels from each other, can be greater than the distance between the scan lines $S_n$, $S_{n+1}$, $S_{n+2}$, . . . and the distance between the data lines $D_m$, $D_{m+1}$, $D_{m+2}$, . . . of the second array unit B1 in the non-camera region B, which are configured to divide the respective subpixels from each other.

As shown in FIG. 2A, when the area of each light emitting part in the camera region A is greater than the area of each light emitting part in the non-camera region B, the area of the anode 1200a (in FIG. 9A) of each light emitting part in the camera region A can be increased in response to the increased area of each light emitting part in the camera region A.

The above-described difference in resolutions between the camera region A and the non-camera region B is merely one example, and the camera region A and the non-camera region B can differ in resolution in some other ways.

As shown in FIG. 3, each subpixel SP1 or SP2 can include a light emitting element OLED1 or OLED2, a driving thin film transistor DT1 or DT2, a switching transistor ST1 or ST2 connected to a gate electrode of the driving thin film transistor DT1 or DT2, and a storage capacitor Cst. In each subpixel SP1 or SP2, the driving thin film transistor DT1 or DT2 is connected to the corresponding light emitting element OLED1 or OLED2, thus adjusting light emission in the subpixel SP1 or SP2. Depending on the properties of the light emitting layer provided in the light emitting elements OLED1 and OLED2, when the light emitting layer includes organic matter as a main component thereof, the light emitting elements OLED1 and OLED2 can be referred to as organic light emitting elements OLED2 and OLED2 and the display device 1000 can be an organic light emitting display device 1000. In another example, when the light emitting layer includes inorganic matter as a main component thereof, the light emitting elements OLED1 and OLED2 can be referred to as inorganic light emitting elements OLED2 and OLED2 and the display device 1000 can be an inorganic light emitting display device 1000. Although FIG. 3 shows circuit diagrams in the case in which organic light emitting elements are used as the light emitting elements OLED1 and OLED2 as one example, inorganic light emitting elements can be used as the light emitting elements OLED1 and OLED2.

In more detail, each subpixel SP1 or SP2 is prepared by the scan line $S_k$ or $S_n$ and the data line $D_j$ or $D_m$ intersecting each other, as shown in FIG. 3. The switching transistor ST1 or ST2, which is provided at the intersection between the scan line $S_k$ or $S_n$ and the data line $D_j$ or $D_m$ so as to be connected to the scan line $S_k$ or $S_n$ and the data line $D_j$ or $D_m$, is turned on by a gate signal of the scan line $S_k$ or $S_n$ and is switched by receiving data voltage from the data line $D_j$ or $D_m$. As circumstances require, a plurality of switching transistors ST1 or ST2 can be provided. The above-described circuit connection of the subpixel SP1 or SP2 can be variously changed.

The driving thin film transistor DT1 or DT2 is arranged between a second supply voltage line VDDL, to which a second supply voltage is supplied, and the light emitting element OLED1 or OLED2, and the driving thin film transistor DT1 or DT2 regulates the current flowing from the second supply voltage line VDDL to the light emitting element OLED1 or OLED2 due to a voltage difference between a gate electrode and a source electrode of the driving thin film transistor DT1 or DT2. The gate electrode of the driving thin film transistor DT1 or DT2 can be connected to a source electrode of the switching transistor ST1 or ST2, the drain electrode of the driving thin film transistor DT1 or DT2 can be connected to the second supply voltage line VDDL, and the source electrode of the driving thin film transistor DT1 or DT2 can be connected to the anode of the light emitting element OLED1 or OLED2. The second supply voltage line VDDL can be a high voltage line to which a high voltage is supplied.

The light emitting element OLED1 or OLED2 emits light using current supplied through the driving thin film transistor DT1 or DT2. The anode of the light emitting element OLED1 or OLED2 can be connected to the source electrode of the driving thin film transistor DT1 or DT2, and the cathode of the light emitting element OLED1 or OLED2 can be connected to a first supply voltage line VSSL to which a first supply voltage is supplied. The first supply voltage line VSSL can be a low voltage line to which a low voltage is supplied.

The light emitting element OLED1 or OLED2 can include the anode, a hole transport layer, a light emitting layer, an electron transport layer and the cathode. Here, in the light emitting element OLED1 or OLED2, when voltage is applied to the anode and the cathode, holes and electrons are moved to the light emitting layer through the hole transport layer and the electron transport layer, and are then recombined in the light emitting layer, thereby emitting light. The light emitting layer can be an organic light emitting layer or an inorganic light emitting layer. In addition to the light emitting layer, the hole transport layer and/or the electron transport layer functioning to transport carriers can be organic layers or inorganic layers, and one of the hole transport layer and the electron transport layer can be an organic layer which is formed in common in the active area.

The capacitor Cst is formed between the gate electrode and the source electrode of the driving thin film transistor DT1 or DT2, and stores a difference Vgs between a gate voltage and a source voltage of the driving thin film transistor DT1 or DT2.

One electrode of the capacitor Cst can be connected to the gate electrode of the driving thin film transistor DT1 or DT2 and the source electrode of the switching transistor ST1 or ST2, and the other electrode of the capacitor Cst can be connected to the source electrode of the driving thin film transistor DT1 or DT2 and the anode of the light emitting element OLED1 or OLED2.

Each of the above-described thin film transistors, i.e., the driving thin film transistors DT1 and DT2 and switching transistors ST1 and ST2, can include a semiconductor layer, the source and drain electrodes connected to both sides of the semiconductor layer, and the gate electrode overlapping the semiconductor layer with a gate insulating film interposed between the gate electrode and the semiconductor layer. The semiconductor layer can include an oxide semiconductor layer, a polysilicon layer or an amorphous silicon layer, or be formed by stacking one or more thereof.

The pad electrodes, to which the scan lines S, the data lines D, and the first and second supply voltage lines VSSL and VDDL, provided in the respective subpixels SP, extend and are connected, are provided in the pad part provided in some regions of the non-active area in FIG. 1, and the pad electrodes are connected to the integrated circuit 900 so that voltage signals can be applied to the respective lines.

The step part 3000a of the substrate 100 according to the present invention is formed by removing the entire thickness of the substrate 100 or a part of the entire thickness of the substrate 100 from a region corresponding to the camera 700. For example, the substrate 100 can be, for example, one of a plastic base material and a glass substrate, and, in some cases, be formed by depositing a plurality of layers. When the substrate 100 is formed to a designated thickness or less, the substrate 100 can be flexible.

When the substrate 100 is formed by depositing a plurality of layers, in one example, the substrate 100 can be formed by interposing an inorganic interlayer insulating film 3120 between a plurality of polymer layers 3110 and 3130, as shown in FIG. 4.

On the second surface (the upper surface) of the substrate 100, a thin film transistor (TFT) array 2000 including the thin film transistors, i.e., the driving thin film transistors DT1 and DT2 and the switching transistors ST1 and ST2 and the capacitors Cst included in the respective subpixels SP, is provided.

As shown in FIG. 4, the light emitting element in the non-camera region includes the anode 120, the first common layer CML1, the light emitting layer 135a, 135b or 135c, the second common layer CML2 and the cathode 140.

The first common layer CLM1 can be a layer relating to hole injection and transport, such as a hole injection layer or a hole transport layer, and the second common layer CML2 can be a layer relating to electron injection and transport, such as an electron injection layer or an electron transport layer. At least one of the first common layer CML1 and the second common layer CML2 can include a plurality of layers, and the light emitting element OLED can include at least one of the first common layer CML1 and the second common layer CML2. When the first common layer CML1 and/or the second common layer CML2 are removed, the light emitting layer 135a, 135b or 135c or other layers can include the components of the removed layer and thus perform the function thereof.

The first and second common layers CML1 and CML2 are continuously formed in common throughout the adjacent subpixels SP1 and SP2 without interruption thereof.

The anode 120 can include a reflective electrode, and the cathode 140 can include a transmissive electrode or a transflective metal. For example, the reflective electrode applied as the anode 120 can be formed of aluminum, an aluminum alloy, a silver alloy, a magnesium alloy, Au—Pt—Cu (APC) or the like, the transmissive electrode applied as the cathode 140 can be formed of indium tin oxide (ITO) or indium zinc oxide (IZO), and the transflective metal applied as the cathode 140 can be AgMg, a silver alloy, a magnesium alloy, Au—Pt—Cu (APC) or the like. As circumstances require, the anode 120 can include a transmissive electrode or a transflective metal, and the cathode can include a reflective electrode.

Further, a touch sensor 400 can be provided on the light emitting element formed by stacking the anode 120, the first common layer CML1, the light emitting layer 135a, 135b or 135c, the second common layer CML2 and the cathode 140. The touch sensor 400 can comprise an encapsulation layer. If the encapsulation layer is provided in the display device, the encapsulation layer is configured to cover the upper surface of the cathode 140 of the light emitting element. The touch sensor 400 can comprise a touch sensing electrode part which can be provided on the encapsulation layer in the touch sensor 400.

In addition, the polarizing plate 250 and a transparent protective film or a transparent protective glass 600 can be provided on the touch sensor 400. The polarizing plate 250 can be provided only above the second array unit.

The transparent film 250a is provided in the same layer as the polarizing plate 250 so as to correspond to the camera region of FIG. 4. In the structure shown in FIG. 4, the polarizing plate 250, the anode 120 including the reflective electrode and the light emitting layer 135a, 135b or 135c can be omitted and the transmittance of the cathode 140 can be increased, thereby increasing the external light recognition ability of the camera 700 when external light enters the camera 700.

The camera 700 includes a lens unit 710 configured to converge external light, a body 720 configured to surround and support the lens unit 710, and a camera substrate 730 having a camera circuit configured to analyze light received by the lens unit 710 and located under the body 720. At least the lens unit 710 and the body 720 of the camera 700 can be inserted into the step part 3000a. Thereby, in an under-display structure in which the camera 700 is located under the substrate 100, a module can be integrated in the vertical direction, and thus slimness of the display device can be achieved.

Hereafter, the significance of the structure of the display device 1000 according to the present invention will be described.

Figure 5:
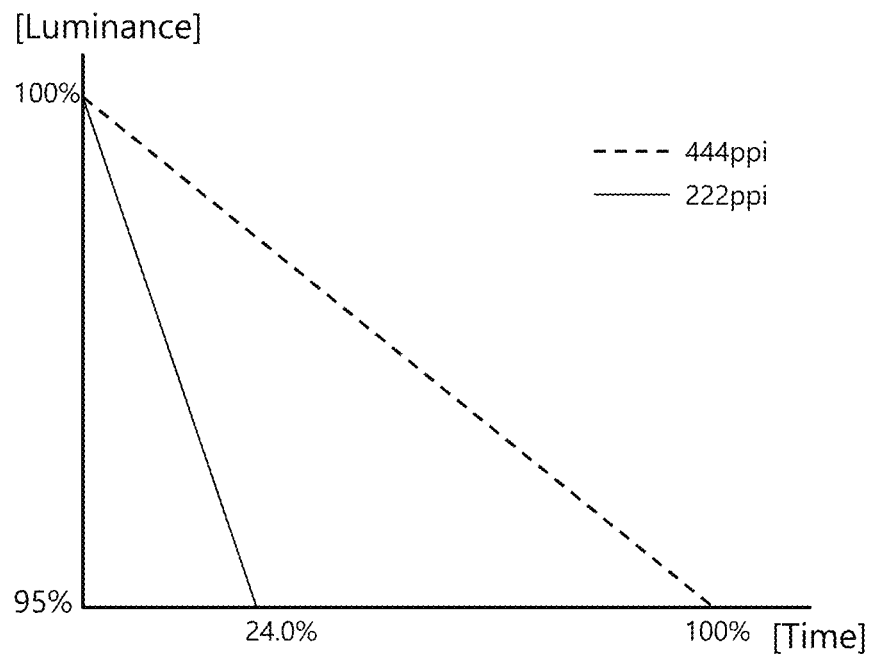
FIG. 5 is a graph showing the lifespans of the region A and the region B shown in FIG. 1, including light emitting parts having the same size.

FIG. 5 is a graph showing the lifespans of the region A having a low resolution and the region B having a high resolution shown in FIG. 1, when they include the light emitting parts having the same size.

In this case, the light emitting part in the region A is in charge of turning on and off of an area four times the area turned on and off by the light emitting part in the region B. Here, in order to realize efficiency of the same level as that of the region B, the amount of current must be increased fourfold, and the driving stress applied to the driving thin film transistor in the region A is increased fourfold compared to the stress applied to the driving thin film transistor in the region B. As this process is repeated, the lifespan of the region A is drastically shortened compared to that of the region B.

Figure 6:
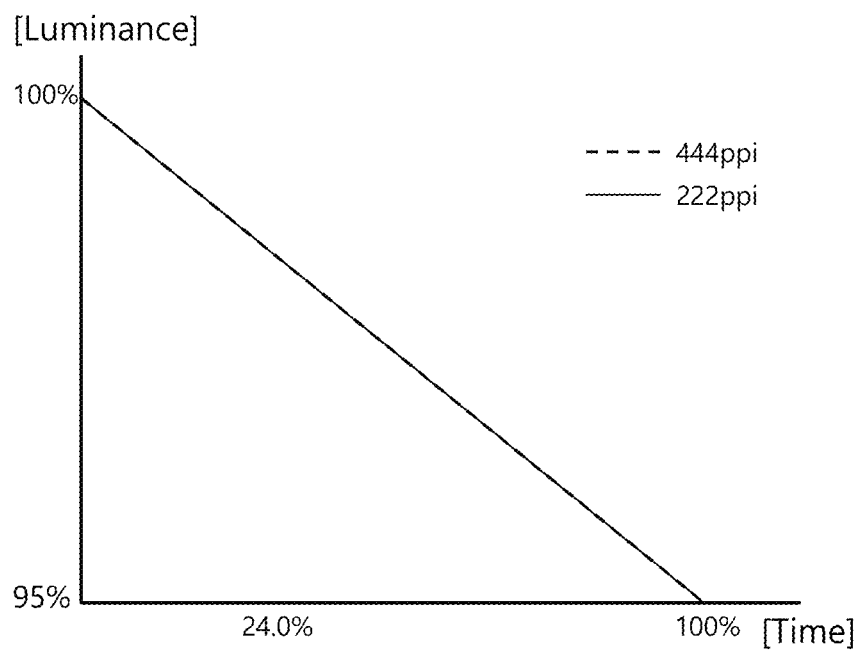
FIG. 6 is a graph showing the lifespans of the region A and the region B, when they include light emitting parts having different sizes, as shown in FIGS. 2A and 2B.

FIG. 6 is a graph showing the lifespans of the region A and the region B, when they include the light emitting parts having different sizes, as shown in FIGS. 2A and 2B.

Referring to FIG. 6, in the display device 1000 according to the present invention in which the region A and the region B having different resolutions include the light emitting parts having different sizes, when the area of the light emitting part in the region A shown in FIG. 2A is set to four times the area of the light emitting part in the region B shown in FIG. 2B, the resolution of the region A is decreased and the size of each light emitting part is increased, and, even if the increased amount of current enters the driving thin film transistor, the current is distributed throughout the light emitting part and the current density is not increased. Thereby, the light emitting part in the region A can be stably operated without lifespan reduction compared to the light emitting part in the region B.

Figure 7:
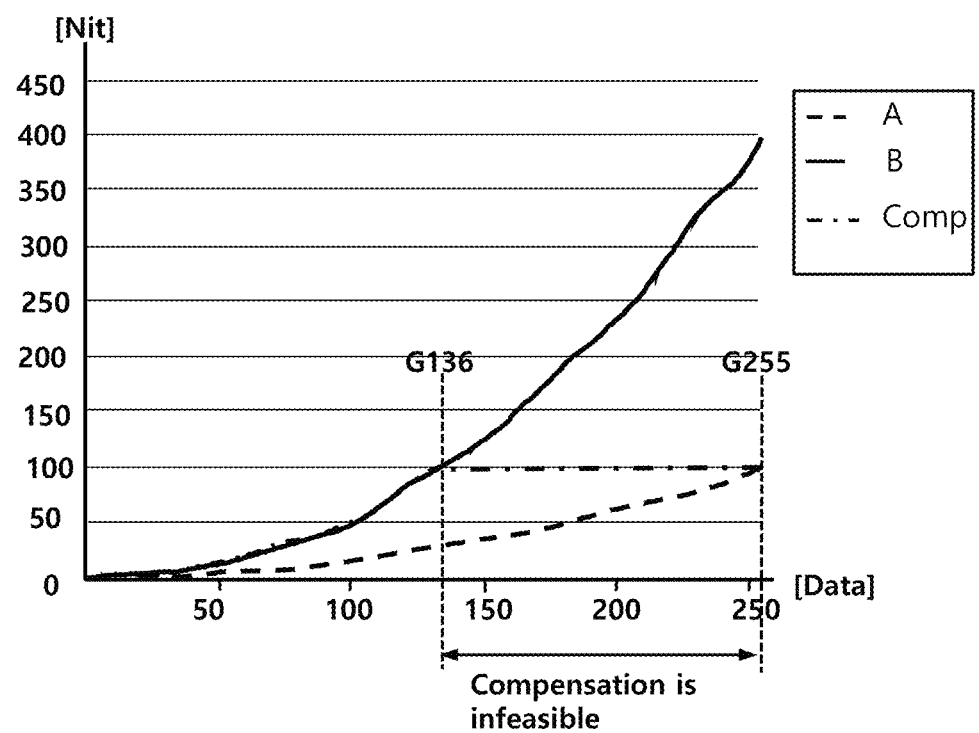
FIG. 7 is a graph showing a grayscale level expression of the region A and the region B, in the structure of FIG. 5.

FIG. 7 is a graph showing a grayscale level expression of the region A and the region B, in the structure of FIG. 5.

FIG. 7 illustrates the graph related to the structure of FIG. 5, i.e., the structure in which the size of the light emitting parts in the low-resolution region and the size of the light emitting parts in the high-resolution region are set to be equal and the sizes of the driving thin film transistors in these regions are set to be equal, current increased fourfold flows to the driving thin film transistors in the region A at the same luminance as compared to the driving thin film transistors in the region B, but there is a limit to the intensity of current for driving the driving thin film transistors due to the increased amount of current, and expression of a grayscale of a designated level or higher is impossible. The region A is incapable of compensating for grayscale level G136 to grayscale level G255 at ½ the resolution of the region B.

In the display device 1000 according to the present invention, as shown in FIGS. 2A to 3, the region A and the region B are implemented as different resolutions, the size of the light emitting part in the low-resolution region (the region A) is set to be greater than the size of the light emitting part in the high-resolution region (the region B), and the active layer of the driving thin film transistor connected to the anode of the light emitting part in the region A has an increased width W1 and a decreased length L1 compared to the active layer of the driving thin film transistor connected to the anode of the light emitting part in the region B, thereby being capable of exhibiting a current distribution effect and increasing output of the driving thin film transistor.

For example, when the ratio of the width to the distance (W2/L2) of the active layer 102b of the second driving thin film transistor DT2 in the array unit B1 of the second region B is 2.7/25 and the ratio of the width to the distance (W1/L1) of the active layer 102a of the first driving thin film transistor DT1 in the array unit A1 of the first region A is 6.5/15, the first driving thin film transistor DT1 can output four times the amount of current output by the second driving thin-film transistor DT2.

Hereinafter, a display device having an active layer, light emitting parts and anodes, which are different from those of the above-described display device 1000 according to the first embodiment, will be described.

Figure 8:
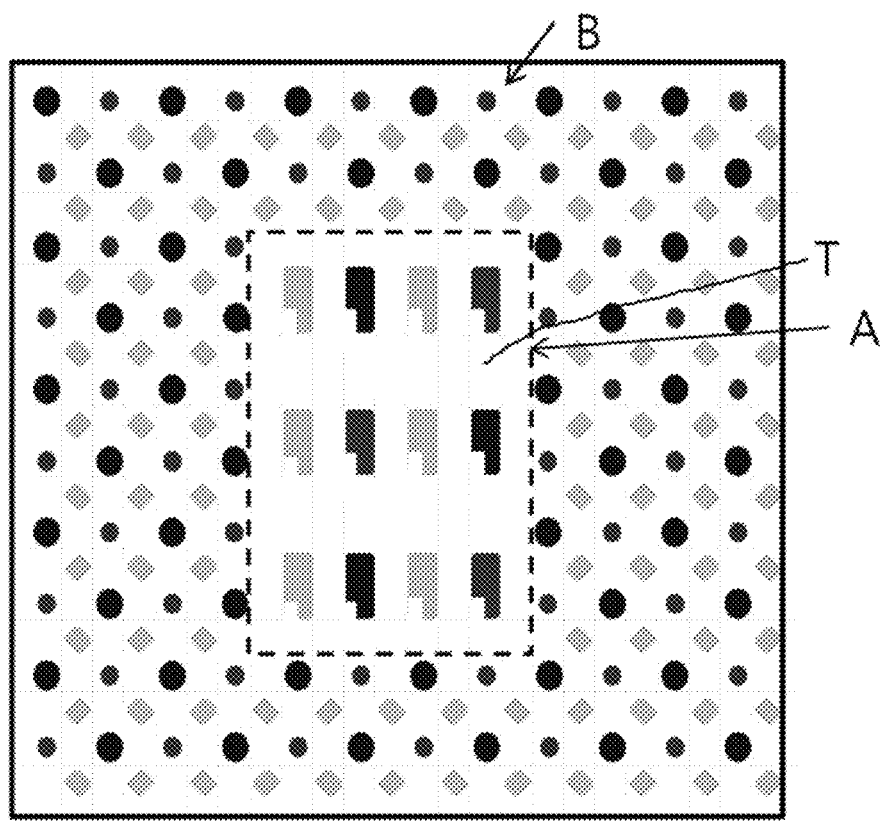
FIG. 8 is a plan view illustrating a display device according to a second embodiment of the present invention.
Figure 10:
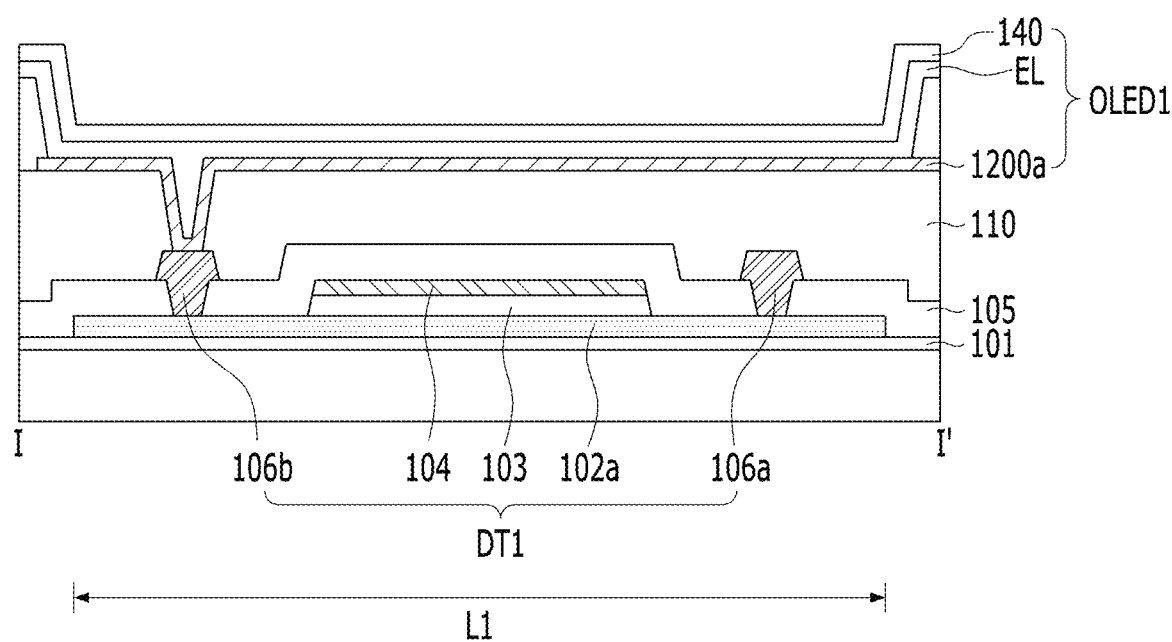
FIG. 10 is a cross-sectional view taken along line I-I' of FIG. 9A.
Figure 11:
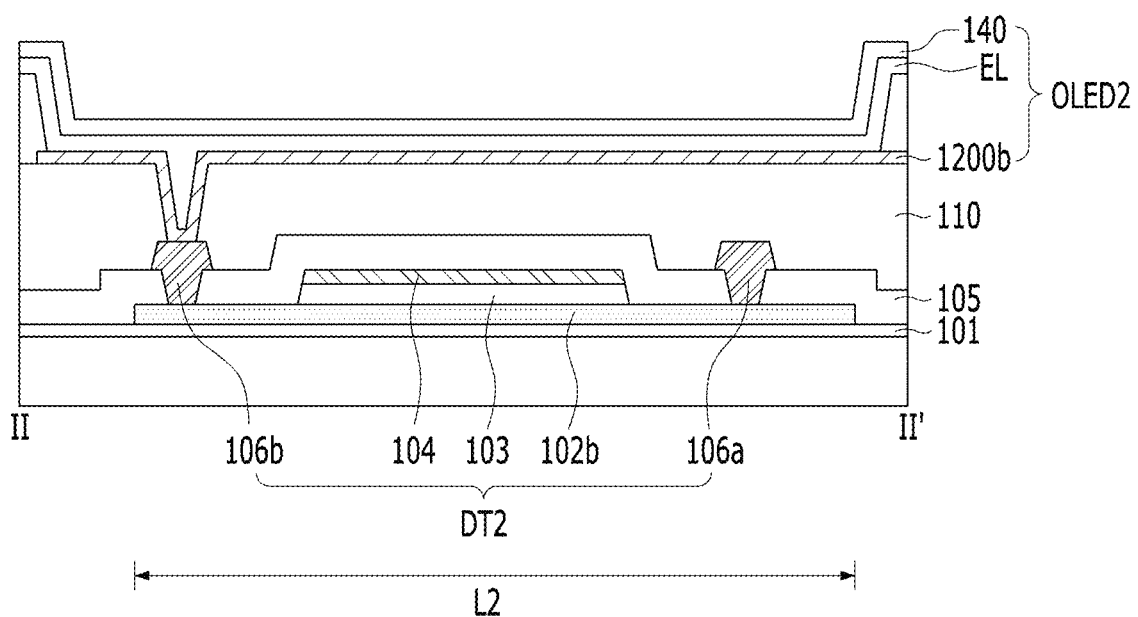
FIG. 11 is a cross-sectional view taken along line II-II' of FIG. 9B.

FIG. 8 is a plan view illustrating a display device according to a second embodiment of the present invention, FIGS. 9A and 9B are plan views illustrating the relationships between a semiconductor layer and an anode of a driving thin film transistor in each of a region A and a region B of the display device according to the second embodiment of the present invention, respectively, FIG. 10 is a cross-sectional view taken along line I-I' of FIG. 9A, and FIG. 11 is a cross-sectional view taken along line II-II' of FIG. 9B.

In the display device according to the second embodiment of the present invention, as shown in FIG. 8, light emitting parts located in a central region, i.e., a region A, have a relatively large area, and light emitting parts located in a region on the periphery of the region A, i.e., a region B, have a relatively small area. The area of each of the light emitting parts of the region A and the region B can be defined by a bank (see 190 in FIG. 4). In addition, in the region B, the light emitting parts of some subpixels are arranged in a diagonal direction.

Further, the light emitting parts are provided at a low resolution in the region A, and thus, a transmission part T can be provided between the light emitting parts spaced apart from each other by an increased distance. No lines can be provided in the transmission part, thereby being capable of improving the recognition performance of a camera.

As shown in FIGS. 9A and 10, a first light emitting part E1 in the region A can be provided inside a first anode 1200a, the first anode 1200a can overlap the bank, and the first light emitting part E1 can be defined by an open area of the bank.

As shown in FIGS. 9B and 11, a second light emitting part E2 in the region B can be provided inside a second anode 1200b, and in order to realize a high resolution, the second light emitting part E2 and the second anode 1200b are inclined in a diagonal direction. However, even in this case, the area of the second light emitting part E2 defined inside the second anode 1200b is ¼ of the area of the above-described first light emitting part E1 in the region A. Here, the second anode 1200b can overlap the bank, and the second light emitting part E2 can be defined by an open area of the bank.

For example, the driving thin film transistor DT1 or DT2 can include a first or second semiconductor layer 102a or 102b formed on a buffer layer 101 in the region A or the region B, a gate insulating film 103 and a gate electrode 104 which partially overlap the first or second semiconductor layer 102a or 102b and are sequentially formed, and a source electrode 106a and a drain electrode 106b which are connected to both sides of the first or second semiconductor layer 102a or 102b. As described above, the first and second semiconductor layers 102a and 102b in the region A and the region B are formed using different ratios of a width to length (W1/L1 and W2/L2).

An interlayer insulating film 105 can be further formed between the gate insulating film 103 and the gate electrode 104, and the source and drain electrodes 106a and 106b, and as circumstances require, a coplanar structure, in which the gate electrode 104 and the source and drain electrodes 106a and 106b are formed in the same layer by omitting the interlayer insulating film 105, can be applied to the driving thin film transistors DT1 and DT2.

The first and second semiconductor layers 102a and 102b can be formed of, for example, an oxide semiconductor, amorphous silicon, polysilicon, or a combination of at least two thereof.

A planarization film 110 is provided so as to cover the driving thin film transistors DT1 and DT2, and the anodes 1200a and 1200b having different sizes depending on the respective resolutions of the regions A and B are provided on the planarization film 110.

Each of the anodes 1200a and 1200b can be connected to the drain electrode 106b of a corresponding one of the driving thin film transistors DT1 and DT2.

An organic electroluminescent layer EL, including a light emitting layer, and a cathode 140 are formed on the respective anodes 1200a and 1200b, thus forming the light emitting elements OLED1 and OLED2.

In this case, the size of the first semiconductor layer 102a of the first driving thin film transistor DT1 and the size of the anode connected to the first driving thin film transistor DT1 located in the low-resolution region are increased, high current is distributed to the increased area, and shortening of the lifespan of the low-resolution region due to application of high current to a restricted area can be prevented.

Figure 12A:
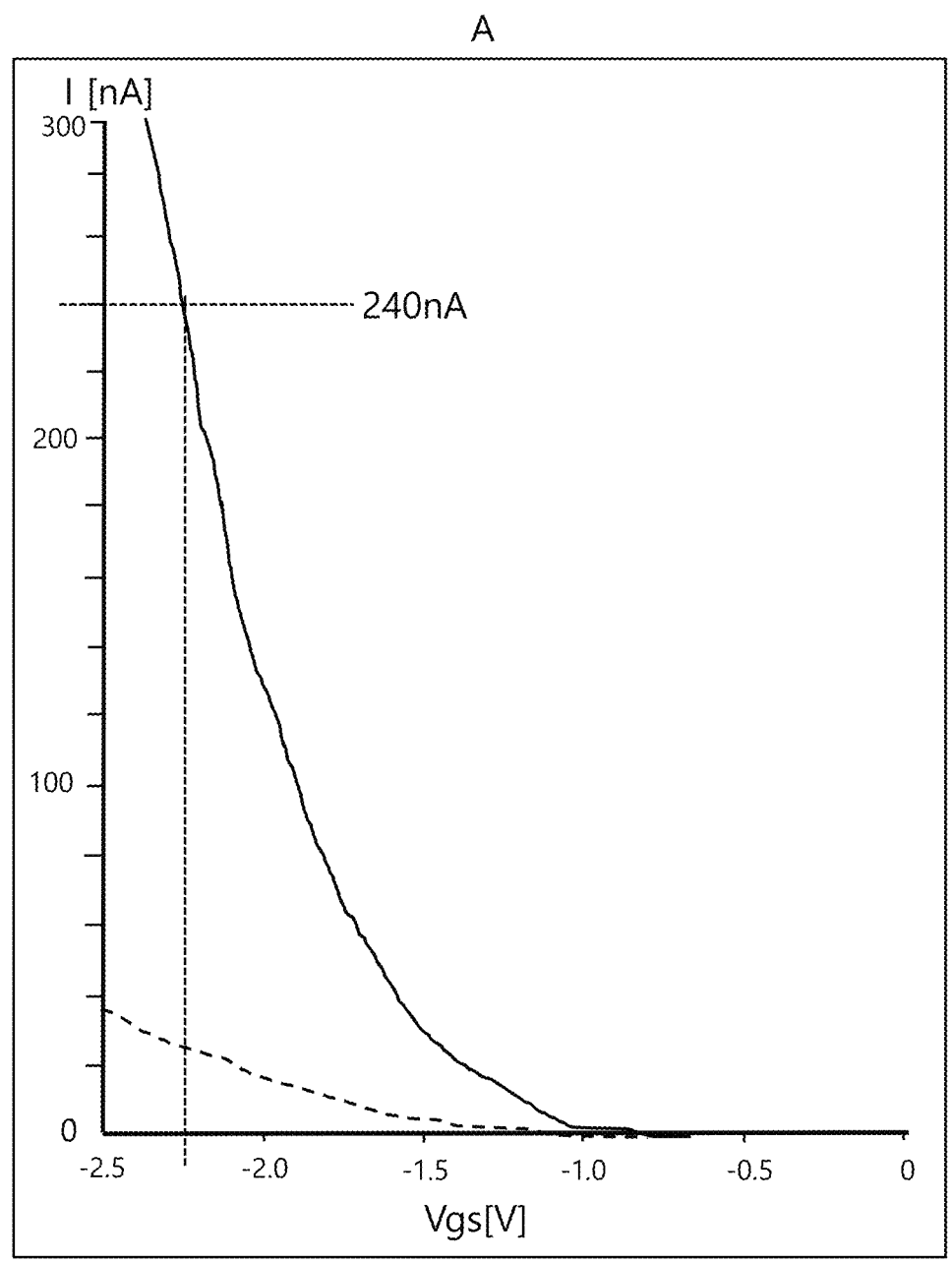
FIGS. 12A and 12B are graphs showing characteristics of Vgs-Ids in driving thin film transistors in the region A and the region B of the display device according to an embodiment of the present invention.
Figure 12B:
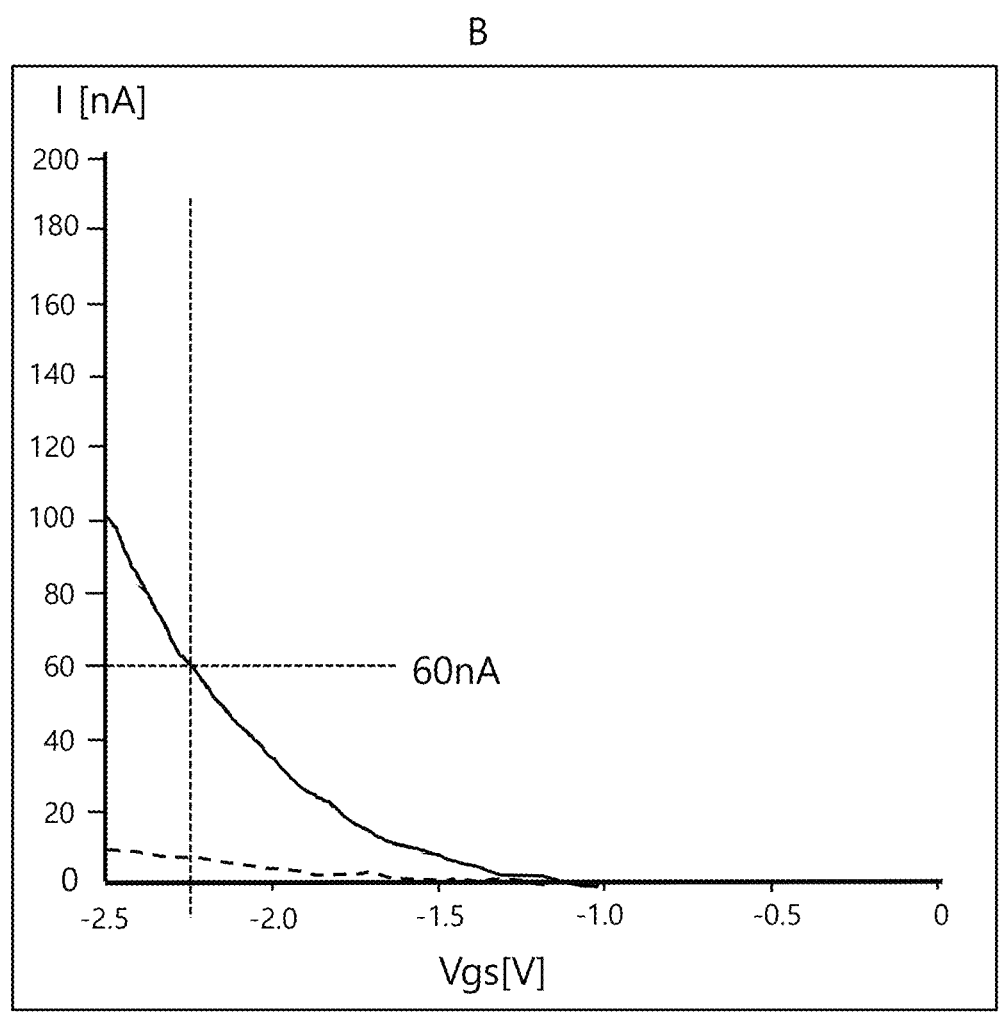

FIGS. 12A and 12B are graphs showing characteristics of Vgs-Ids (drain-source current) in the driving thin film transistors in the region A and the region B of the display device according to the present invention.

In the display device according to one or more embodiments of the present invention, in which regions having different resolutions have different light emitting areas and in which the active layers of the driving thin film transistors in the respective regions have different areas corresponding to the sizes of light emitting areas, when the area of the active layer of each driving thin film transistor in the low-resolution region, i.e., the region A, shown in FIG. 12A is set to be four times the area of the active layer of each driving thin film transistor in the high-resolution region, i.e., the region B, shown in FIG. 12B, the resolution of the region A is decreased but the size of each light emitting part in the region A is increased, and thus the amount of current entering the driving thin film transistor in the region A is increased approximately fourfold compared to current entering the driving thin film transistor in the region B. The result of FIG. 12A is for a case where the active layer is formed in a rectangular shape as shown in FIG. 9A in the low-resolution region of the region A, and the W/L is set to 6.5 μm/15 μm. Also, the result of FIG. 12B is for a case where the active layer is formed in a thin 'U'-shape as shown in FIG. 9B in the high-resolution region of the region B, and the W/L is set to 2.7 μm/25 μm. By increasing the area of the active layer at the low-resolution region A, a relatively high current flows in the same gray color as the high-resolution region B. For example, the low-resolution region A and the high-resolution region B drive their each driving thin film transistor with the same data voltage Vgs without any changing a driver IC for providing the driving voltage. In this case, it is possible that a higher current is applied by increasing the area of the active layer in the low-resolution region A.

Further, because current is distributed throughout the light emitting part, current density is not increased, and the light emitting part in the region A can be stably operated without lifespan reduction.

The above-described display device according to one or more embodiments of the present invention increases the area of each light emitting part in the low-resolution region, thereby being capable of maintaining the same luminance as in the high-resolution region when the low-resolution region is driven.

Here, in order to increase the intensity of current corresponding to the increased area of the light emitting part having the low resolution, the size of the active layer of the driving thin film transistor is increased, and thus, the amount of current per subpixel in the region having the active layer with the increased size can be increased.

Therefore, the driving thin film transistors having different resolutions can be driven using the same driver IC without addition of a separate driver IC.

To accomplish this, a display device according to one or more embodiments of the present invention can include a substrate divided into a first region and a second region, a first array unit provided in the first region and including at least one subpixel including a first light emitting part provided therein, and a second array unit provided in the second region and including a plurality of subpixels, each subpixel including a second light emitting part having a smaller area than an area of the first light emitting part, and an area of a first active layer of the at least one subpixel in the first array unit can be greater than an area of a second active layer of each of the subpixels of the second array unit.

A camera can be provided under the first region of the substrate.

A first driving thin film transistor of the at least one subpixel in the first array unit and a second driving thin film transistor of each of the subpixels of the second array unit can include the first active layer and the second active layer, respectively.

The first and second driving thin film transistors can be conductively connected to one driver IC.

The first driving thin film transistor can be driven at a higher current than the second driving thin film transistor by the same data voltage.

The first active layer can have a first width and a first length, and the second active layer can have a second width smaller than the first width or a second length greater than the first length.

The first active layer can have a first width and a first length, and the second active layer can have a second width smaller than the first width and a second length greater than the first length.

The at least one subpixel of the first array unit can include the first driving thin film transistor and a first light emitting element connected to the first driving thin film transistor, each of the subpixels of the second array unit can include the second driving thin film transistor and a second light emitting element connected to the second driving thin film transistor, each of the first and second light emitting elements can include an anode, a light emitting layer and a cathode, and an area of the anode of the first light emitting element can be greater than an area of the anode of the second light emitting element.

The first active layer can overlap the anode of the first light emitting element, and the second active layer can overlap the anode of the second light emitting element.

The display device can further include at least one of a first common layer provided between the anode and the light emitting layer and a second common layer provided between the cathode and the light emitting layer, and the first common layer and the second common layer can be continuously formed over the subpixels of the first and second array units.

The display device can further include an optical film configured to cover the first and second array units, the optical film can include a polarizing plate, and the polarizing plate can be provided only above the second array unit.

The display device can further include a transparent film provided in the same layer as the polarizing plate above the first array unit.

The substrate can include a first polymer layer, an inorganic interlayer insulating film and a second polymer layer, and the first and second array units can be provided on the second polymer layer.

The first polymer layer can be a colored film or a transparent film, and the second polymer layer can be a transparent film.

A portion having a first thickness smaller than an entire thickness of the substrate can be removed from a lower surface of a portion of the substrate corresponding to the camera.

The camera can be inserted into the portion of the substrate corresponding to the camera, from which the portion having the first thickness is removed.

A protective member can be further provided on the lower surface of the substrate except for the portion thereof corresponding to the camera.

As is apparent from the above description, a display device according to the present invention has the following effects.

The area of each light emitting part in a low-resolution region is increased, and thus, the low-resolution region can maintain the same luminance as in a high-resolution region when the low-resolution region is driven.

Here, in order to increase the intensity of current corresponding to the increased area of the light emitting part in the low-resolution region, the size of the active layer of a driving thin film transistor in the low-resolution region is increased, and thus, the amount of current per subpixel in the region having the active layer with the increased size can be increased.

Therefore, driving thin film transistors having different resolutions can be driven using the same driver IC without addition of a separate driver IC.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:
1. A display device comprising:
   a substrate including a first region and a second region;
   a first array unit in the first region, and comprising at least one subpixel comprising a first light emitting part; and
   a second array unit in the second region, and comprising a plurality of subpixels,
   each of the plurality of subpixels comprising a second light emitting part having a smaller area than an area of the first light emitting part,
   wherein an area of a first active layer of the at least one subpixel in the first array unit is greater than an area of a second active layer of each of the subpixels of the second array unit.

2. The display device according to claim 1, wherein a camera is provided under the first region of the substrate.

3. The display device according to claim 2, wherein a portion of the substrate has a first thickness smaller than an entire thickness of the substrate, and is removed from a lower surface of a portion of the substrate corresponding to the camera.

4. The display device according to claim 3, wherein the camera is inserted into the portion of the substrate corresponding to the camera, from which the portion of the substrate having the first thickness is removed.

5. The display device according to claim 4, wherein a protective member is further provided on the lower surface of the substrate, except for the portion thereof corresponding to the camera.

6. The display device according to claim 1, wherein a first driving thin film transistor of the at least one subpixel in the first array unit and a second driving thin film transistor of each of the subpixels of the second array unit comprise the first active layer and the second active layer, respectively.

7. The display device according to claim 6, wherein the first and second driving thin film transistors are electrically connected to one driver integrated circuit (IC).

8. The display device according to claim 6, wherein the first driving thin film transistor is driven at a higher current than the second driving thin film transistor by a same data voltage.

9. The display device according to claim 6, wherein:
the first active layer has a first width and a first length; and
the second active layer has a second width smaller than the first width or a second length greater than the first length.

10. The display device according to claim 6, wherein:
the first active layer has a first width and a first length; and
the second active layer has a second width smaller than the first width and a second length greater than the first length.

11. The display device according to claim 6, wherein:
the at least one subpixel of the first array unit comprises the first driving thin film transistor and a first light emitting element connected to the first driving thin film transistor;
each of the subpixels of the second array unit comprises the second driving thin film transistor and a second light emitting element connected to the second driving thin film transistor;
each of the first and second light emitting elements comprises an anode, a light emitting layer and a cathode; and
an area of the anode of the first light emitting element is greater than an area of the anode of the second light emitting element.

12. The display device according to claim 11, wherein:
the first active layer overlaps the anode of the first light emitting element; and
the second active layer overlaps the anode of the second light emitting element.

13. The display device according to claim 11, further comprising at least one of a first common layer provided between the anode and the light emitting layer and a second common layer provided between the cathode and the light emitting layer,
wherein the first common layer and the second common layer are continuously formed over the subpixels of the first and second array units.

14. The display device according to claim 1, further comprising an optical film configured to cover the first and second array units,
wherein the optical film comprises a polarizing plate, and the polarizing plate is provided only above the second array unit.

15. The display device according to claim 14, further comprising a transparent film in the same layer as the polarizing plate above the first array unit.

16. The display device according to claim 1, wherein the substrate comprises a first polymer layer, an inorganic interlayer insulating film and a second polymer layer, and
wherein the first and second array units are provided on the second polymer layer.

17. The display device according to claim 16, wherein the first polymer layer is a colored film or a transparent film, and the second polymer layer is a transparent film.

* * * * *